United States Patent
Tran

(10) Patent No.: US 6,865,105 B1
(45) Date of Patent: Mar. 8, 2005

(54) THERMAL-ASSISTED SWITCHING ARRAY CONFIGURATION FOR MRAM

(75) Inventor: Lung T. Tran, Saratoga, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 9 days.

(21) Appl. No.: 10/668,405

(22) Filed: Sep. 22, 2003

(51) Int. Cl.⁷ .............................................. G11C 11/00
(52) U.S. Cl. ........................ 365/158; 365/171; 365/173
(58) Field of Search ................................ 365/158, 171, 365/173, 63

(56) References Cited

U.S. PATENT DOCUMENTS

| | | | |
|---|---|---|---|
| 6,163,477 A | 12/2000 | Tran | |
| 6,385,082 B1 | 5/2002 | Abraham et al. | |
| 6,504,221 B1 * | 1/2003 | Tran et al. | 257/421 |
| 6,535,416 B1 | 3/2003 | Daughton et al. | |
| 6,603,678 B2 | 8/2003 | Nickel et al. | |
| 6,728,132 B2 * | 4/2004 | Deak | 365/173 |
| 6,781,910 B2 * | 8/2004 | Smith | 365/225.5 |
| 6,819,587 B1 * | 11/2004 | Sharma | 365/173 |
| 2003/0007398 A1 | 1/2003 | Daughton et al. | |

OTHER PUBLICATIONS

R.H. Koch et al. "Thermally Assisted Magnetization Reversal in Submicron–Sized Magnetic Thin Films," Phys. Rev. Lett., pp. 5419–5422, vol. 84, No. 23, Jun. 5, 2000.

* cited by examiner

Primary Examiner—Son T. Dinh

(57) ABSTRACT

This invention provides a thermal-assisted switching magnetic memory storage device. In a particular embodiment, a cross-point array of conductive rows and columns is provided with offset tunnel junction magnetic memory cells provided proximate to the intersections between the rows and columns. A looping write conductor is provided close to, but not in electrical contact with each memory cell. The looping write conductor loops across the top and bottom of each memory cell. Each magnetic memory cell provides a magnetic data layer characterized by a material wherein the coercivity is decreased upon an increase in temperature, an intermediate layer, and a reference layer. The magnetic fields provided by the looping write conductor during a write operation are not sufficient to alter the magnetic orientation of an unheated data layer, but may alter the data layer of a memory cell warmed by a bias current tunneling through the memory cell.

25 Claims, 4 Drawing Sheets

THERMAL-ASSISTED SWITCHING ARRAY CONFIGURATION FOR MRAM

FIELD OF THE INVENTION

This invention relates generally to magnetic memory devices and in particular to ultra-high density thermally assisted magnetic random access memory arrays (commonly referred to as "MRAM").

BACKGROUND OF THE INVENTION

Today's computer systems are becoming increasingly sophisticated, permitting users to perform an ever greater variety of computing tasks at faster and faster rates. The size of the memory and the speed at which it can be accessed bear heavily upon the overall speed of the computer system.

Memory for a computer system is technically any form of electronic, magnetic or optical storage; however it is generally divided up into different categories based in part upon speed and functionality. The two general categories of computer memory are main memory and mass storage. Main memory is generally comprised of fast, expensive volatile random access memory that is connected directly to the processor by a memory bus. One component of the speed in main memory is generally that access to a particular memory cell is handled without physical movement of components.

Generally, the principle underlying the storage of data in a magnetic media (main or mass storage) is the ability to change, and/or reverse, the relative orientation of the magnetization of a storage data bit (i.e. the logic state of a "0" or a "1"). The coercivity of a material is the level of demagnetizing force that must be applied to a magnetic particle to reduce and/or reverse the magnetization of the particle. Generally speaking, the smaller the magnetic particle the higher it's coercivity.

A prior art magnetic memory cell may be a tunneling magneto-resistance memory cell (TMR), a giant magneto-resistance memory cell (GMR), or a colossal magneto-resistance memory cell (CMR), each of which generally includes a data layer (also called a storage layer or bit layer), a reference layer, and an intermediate layer between the data layer and the reference layer. The data layer, the reference layer, and the intermediate layer can be made from one or more layers of material.

The data layer is usually a layer of magnetic material that stores a bit of data as an orientation of magnetization that may be altered in response to the application of an external magnetic field or fields. More specifically, the orientation of magnetization of the data layer representing the logic state can be rotated (switched) from a first orientation representing a logic state of "0" to a second orientation, representing a logic state of "1", and/or vice versa.

The reference layer is usually a layer of magnetic material in which an orientation of magnetization is "pinned", as in fixed, in a predetermined direction. Often several layers of magnetic material are required and function as one to effectuate a stable pinned reference layer. The predetermined direction is determined and established by microelectronic processing steps employed in the fabrication of the magnetic memory cell.

Typically, the logic state (a "0" or a "1") of a magnetic memory cell depends on the relative orientations of magnetization in the data layer and the reference layer. For example, when an electrical potential bias is applied across the data layer and the reference layer in a TMR, electrons migrate between the data layer and the reference layer through the intermediate layer. The intermediate layer is typically a thin dielectric layer commonly referred to as a tunnel barrier layer. The phenomena that cause the migration of electrons through the barrier layer may be referred to as quantum mechanical tunneling or spin tunneling.

The logic state may be determined by measuring the resistance of the memory cell. For example, if the overall orientation of the magnetization in the data storage layer is parallel to the pinned orientation of magnetization in the reference layer the magnetic memory cell will be in a state of low resistance. If the overall orientation of the magnetization in the data storage layer is anti-parallel (opposite) to the pinned orientation of magnetization in the reference layer the magnetic memory cell will be in a state of high resistance.

In an ideal setting the orientation of the alterable magnetic field in the data layer would be either parallel or anti-parallel with respect to the field of the reference layer. As the data layer and the reference layer are generally both made from ferromagnetic materials and are positioned in close permanent proximity to each other, the generally stronger reference layer may affect the orientation of the data layer. More specifically, the magnetization of the reference layer may generate a demagnetization field that extends from the reference layer into the data layer.

The result of this demagnetization field from the reference layer is an offset in the coercive switching field. This offset can result in asymmetry in the switching characteristics of the bit: the amount of switching field needed to switch the bit from parallel to anti-parallel state is different from the switching field needed to switch the bit from anti-parallel state to parallel state. To have reliable switching characteristics and to simplify the read/write circuitry, it is desirable to have this offset reduced to as near zero as possible.

The magneto-resistance $\Delta R/R$ may be described as akin to a signal-to-noise ratio S/N. A higher S/N results in a stronger signal that can be sensed to determine the state of the bit in the data layer. Thus, at least one disadvantage of a tunnel junction memory cell having a pinned reference layer in close and fixed proximity to the data layer is a potential reduction in the magneto-resistance $\Delta R/R$ resulting from the angular displacement.

To pin the reference layer during manufacturing, the reference layer must be heated to an elevated temperature in an annealing step. The annealing step typically takes time, perhaps an hour or more. As the reference layer is but one part of the memory being produced, the entire memory must be subject to temperatures ranging from about 200 to 300 degrees centigrade while under the influence of a constant and focused magnetic field. Such manufacturing stresses may permit the reference layer to become un-pinned and lose it's set orientation if the memory is later subjected to high temperatures. In addition, the characteristics of the data layer may be unknowingly affected by heat during some manufacturing processes.

To facilitate establishing a pinned reference layer it is not uncommon for the reference layer to include multiple layers of material. While utilizing multiple layers may help insure that the reference layer remains pinned, it also raises the complexity of manufacturing each and every memory cell present in the magnetic memory.

Main memory devices such as MRAM often employ tunnel junction magnetic memory cells positioned at the transverse intersections of electrically conductive rows and columns. Such an arrangement is known as a cross-point memory array.

In a typical cross-point memory array, while any given row (row A, B, C . . . ) may cross every column (column 1, 2, 3 . . . ), and visa-versa, the traditional principles of column and row arrays dictate that any given row will only cross any given column once. Therefore, by accessing a particular row (B) and a particular column (3), any one memory cell positioned at their intersection (B,3) can be isolated from any other memory cell in the array. Such individual indexing is not without complexities.

As between the two fundamental operations that may be performed on a storage bit (a "write" or a "read"), the write operation is generally more complex. In many operations write operations occur less frequently then read operations, and, in certain situations, may occur orders of magnitude less often.

With respect to traditional cross-point memory arrays, while the magnetic field of the data layer of a desired cell may be altered, it is desirable not to adversely affect or alter the data layers of neighboring cells. Therefore, design and manufacturing issues are generally focused upon the requirements imposed by the write operation. As write operations generally requiring greater electrical current and magnetic fields, requiring more robust characteristics in the power supply, row and column conductors and appropriate buffering space.

With respect to magnetic memory components, it is well known that as size decreases coercivity increases. A large coercivity is generally undesirable, as it requires a greater magnetic field to be switched, which in turn requires a greater power source and potentially larger switching transistors. Providing large power sources and large switching transistors is generally at odds with the focus of nanotechnology to reduce the necessary size of components. In addition, to mitigate the potential of inadvertently switching a neighboring memory cell, nanometer scaled memory cells are generally more widely spaced relative to their overall size than are non-nanometer sized memory cells. Moreover, as the size of the magnetic memory decreases, the unused space between individual memory cells tends to increase.

Hence, in a typical MRAM array a significant amount of overall space may be used simply to provide a physical buffer between the cells. Absent this buffering space, or otherwise reducing it's ratio, a greater volume of storage in the same physical space could be obtained.

Hence, there is a need for an ultra-high density thermally assisted memory array which overcomes one or more of the drawbacks identified above. The present invention satisfies one or more of these needs.

SUMMARY

This invention provides a thermal-assisted switching magnetic memory array.

In particular, and by way of example only, according to an embodiment of the present invention, this invention provides a thermal-assisted magnetic memory storage device including: a cross point array of magnetic tunnel junction memory cells, the memory cells characterized by a material wherein the coercivity is decreased upon an increase in temperature; a plurality of separate looping write conductors positioned within close proximity about each magnetic tunnel junction memory cell.

Moreover, according to an embodiment thereof, the invention may provide a thermal-assisted magnetic memory storage device including: a plurality of parallel electrically conductive rows; a plurality of parallel electrically conductive columns transverse to the rows, the columns and rows thereby forming a cross point array with a plurality of intersections; a plurality of offset magnetic tunnel junction memory cells, each memory cell located proximately to and in electrical contact with an intersection between a row and column, the memory cells characterized by a material with an alterable orientation of magnetization, wherein the coercivity of the alterable material is decreased upon an increase in temperature; and a plurality of separate looping write conductors positioned within close proximity about each magnetic tunnel junction memory cell.

In yet another embodiment, the invention may provide a thermal-assisted magnetic memory storage device including: a plurality of parallel electrically conductive rows; a plurality of parallel electrically conductive columns transverse to the rows, the columns and rows thereby forming a cross point array with a plurality of intersections; a plurality of offset magnetic tunnel junction memory cells, each memory cell located proximately to and in electrical contact with an intersection between a row and column, each memory cell including: a top offset electrical conductor joined to the row and extending substantially transversely from the row for a length at least the width of the memory cell; at least one ferromagnetic data layer characterized by an alterable orientation of magnetization, the ferromagnetic data layer characterized by a material wherein the coercivity is decreased upon an increase in temperature; an intermediate layer in contact with the data layer; a ferromagnetic reference layer in contact with the intermediate layer, opposite from the data layer; a bottom offset electrical conductor parallel to and of substantially the same length as the top offset conductor, the bottom offset conductor joined to the column; wherein the top and bottom offset conductors laterally offset the top and bottom of the memory cell from the cross point of the row and column, the bottom offset conductor additionally vertically offsetting the memory cell from the column; and a plurality of separate looping write conductors positioned within close proximity to the top and bottom offset conductors of each memory cell, the looping write conductors substantially in line with the laterally offset magnetic tunnel junction memory cells.

In still another embodiment, the invention may provide a computer system including: a main board; at least one central processing unit (CPU)joined to the main board; at least one thermal-assisted magnetic memory store joined to the CPU by the main board, thermal-assisted magnetic memory including: a plurality of parallel electrically conductive rows; a plurality of parallel electrically conductive columns transverse to the rows, the columns and rows thereby forming a cross point array with a plurality of intersections; a plurality of offset magnetic tunnel junction memory cells, each memory cell located proximately to and in electrical contact with an intersection between a row and column, the memory cells characterized by a material with an alterable orientation of magnetization, wherein the coercivity of the alterable material is decreased upon an increase in temperature; and a plurality of separate looping write conductors positioned within close proximity about each magnetic tunnel junction memory cell.

These and other objects, features a nd advantages of the preferred method and apparatus will become apparent from the following detailed description, taken in conjunction with the accompanying drawings which illustrate, by way of example the principles of the invention.

DETAILED DESCRIPTION

Before proceeding with the detailed description, it is to be appreciated that the present invention is not limited to use or application with a specific type of magnetic memory. Thus, although the present invention is, for the convenience of explanation, depicted and described with respect to typical exemplary embodiments, it will be appreciated that this invention may be applied with other of magnetic memory.

Figure 1A:
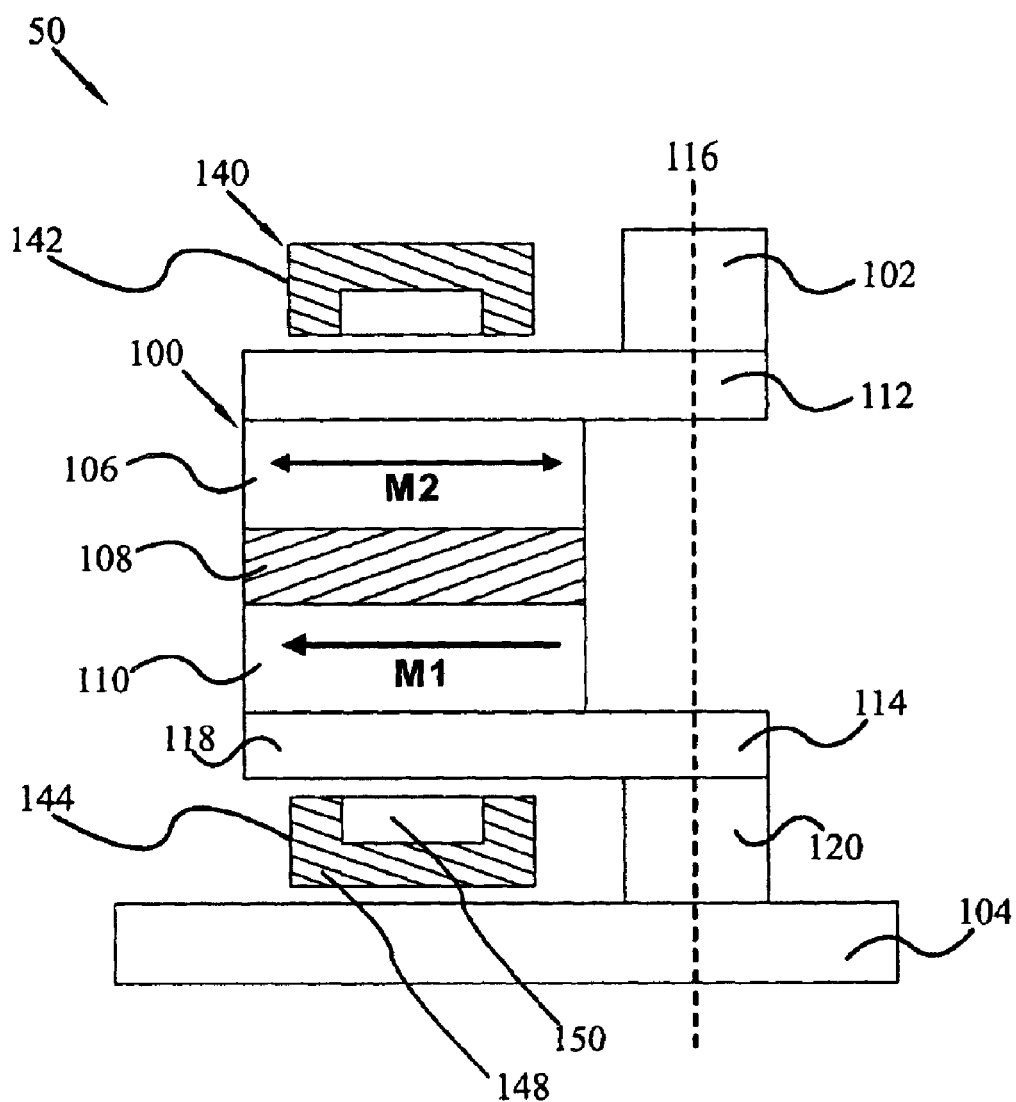
FIG. 1A shows a portion of an exemplary thermal-assisted magnetic memory embodying the present invention.
Figure 1B:
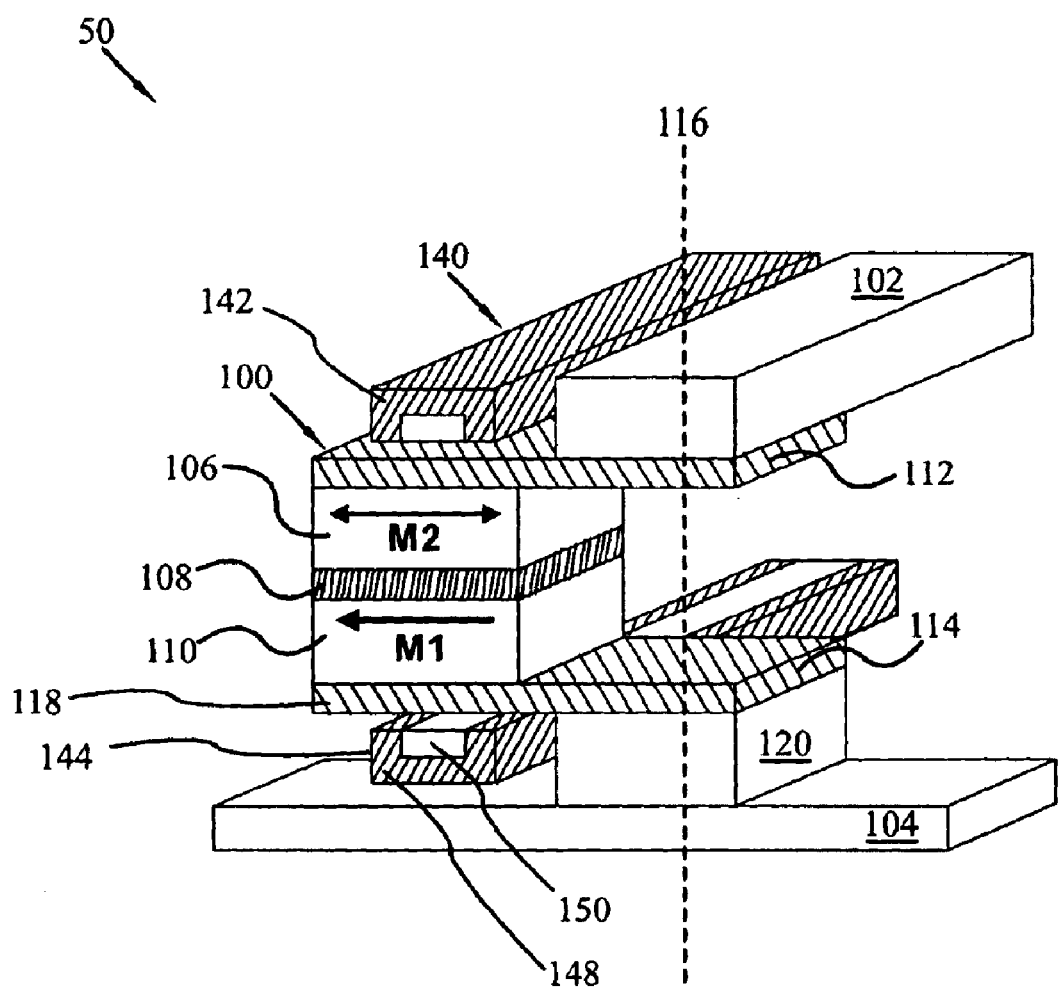
FIG. 1B is a perspective view of the memory as shown in FIG. 1.

Referring now to the drawings, and more particularly to FIG. 1A and the perspective of FIG. 1B, there is shown a portion of a thermal-assisted switching magnetic memory 50, having at least one magnetic memory cell 100 and at least one separate looping write conductor 140, positioned proximate to the memory cell 100, according to an embodiment of the present invention. In at least one embodiment, the magnetic memory cell 100 may be a magnetic memory tunnel junction memory cell. Specifically, the memory 50 provides a plurality of parallel electrically conductive rows and parallel electrically conductive columns transverse to the rows. Memory cell 100 is located at an offset position proximate to and in electrical contact with an intersection of a row 102 and a column 104.

The magnetic memory cell 100 itself, may have a ferromagnetic data layer 106, an intermediate layer 108, and a ferromagnetic reference layer 110 with orientation of magnetization M1. The ferromagnetic data layer 106 permits the storing of a bit of data as an alterable orientation of magnetization M2, and consists of a material wherein the coercivity is decreased upon an increase in temperature. The intermediate layer 108 has opposing sides such that the data layer 106 in contact with one side is in direct alignment with, and substantially uniformly spaced from, the reference layer 110, in contact with the second side of the intermediate layer 108.

In at least one embodiment, the offset placement of the magnetic memory cell 100 relative to the cross point intersection of row 102 and column 104 is achieved with the use of offsetting conductors. Specifically, magnetic memory cell 100 may be joined to the conductive row 102 by a thin top offset conductor 112 and joined to the conductive column 104 by a thin bottom offset conductor 114. The top offset conductor 112 may be joined to the row 102 such that it extends substantially transversely from the row for a length that may be at least the width of magnetic memory cell 100. The bottom offset conductor 114 is parallel too, and of substantially the same length as, the top offset conductor 112. So as to provide space between the column conductor 104 and the bottom of the offset magnetic memory cell 100, the bottom offset conductor 114 may also provide a vertical offset. This vertical offset may be achieved by thickening one end of the bottom offset conductor 114, fabricating the bottom offset conductor 114 from a lateral component 118 and a base component 120, or such other process as may be appropriate.

As shown, the top and bottom offset conductors (112 and 114) laterally displace the magnetic memory cell 100 from the cross point axis 116. The lateral displacement of the magnetic memory cell 100 places the magnetic memory cell 100 substantially between the looping write conductor 140.

It may be further appreciated in FIG. 1A, that the looping write conductor 140 is not in electrical contact with the magnetic memory cell 100 or the electrically conductive row 102 or electrically conductive column 104. Moreover, the looping write conductor 140 may not be in physical contact with the magnetic memory cell 100.

Figure 2:
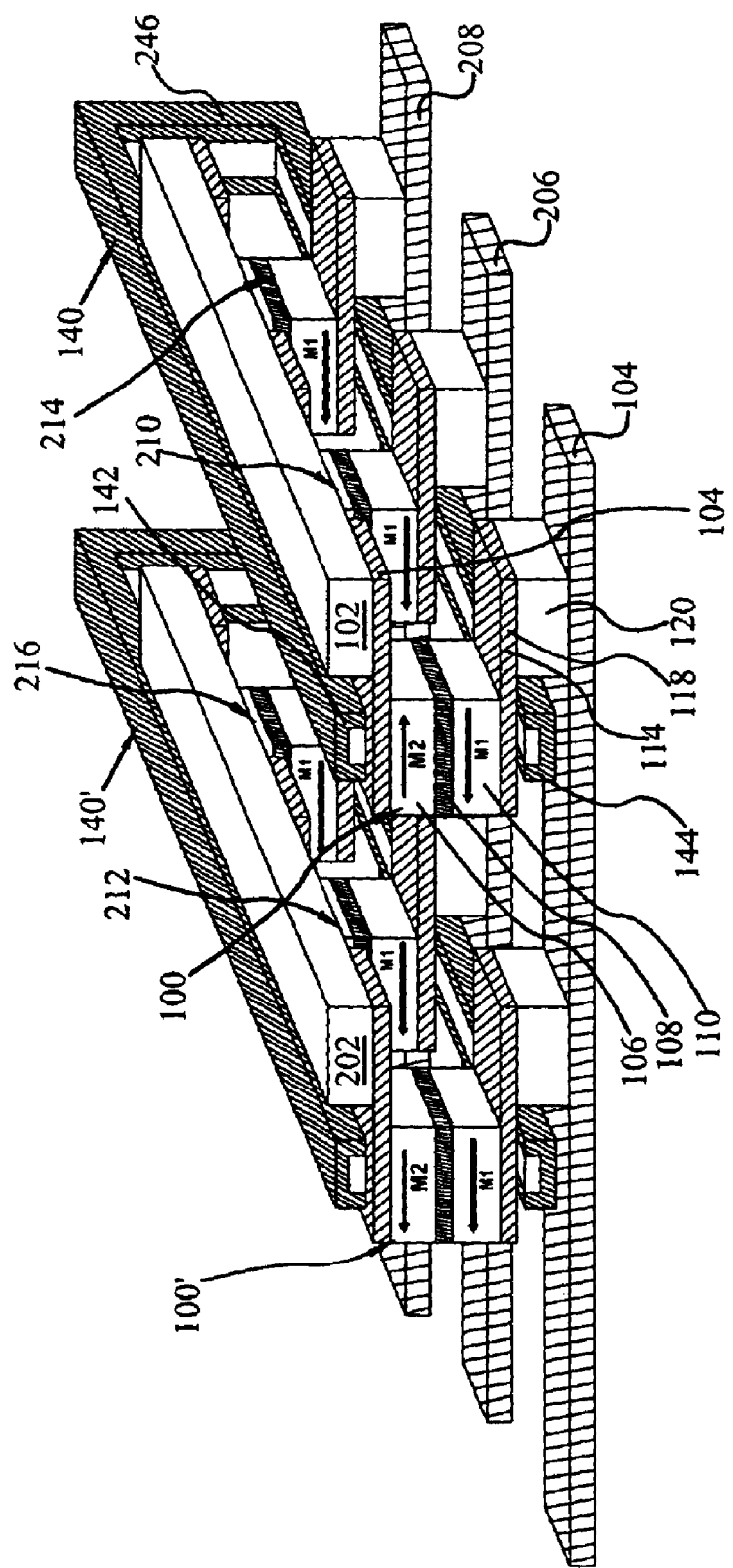
FIG. 2 is a perspective of an array of memory as shown in FIG. 1.

FIG. 2 conceptually illustrates a larger portion of a cross point array 200 with a plurality of magnetic memory cells 100, 100', 210, 212, 214, and 216. More specifically, parallel rows 102 and 202 are located above and transverse to parallel columns 104, 206 and 208. Each magnetic memory cell (100, 100', 210, 212, 214, and 216) is offset from the cross-point of a given row (102 or 202) and a given column (104, 206 or 208). The looping nature of looping write conductor 140 and 140' may be more fully appreciated with reference to FIG. 2, depicting the top 142 and bottom 144 portions of the loop being achieved with a vertical transition 246. As the top 142 and bottom 144 portions are opposite and parallel, it will be appreciated that a current flowing in a first direction in the top 142 portion will appear to flow in the opposite direction in the bottom 144 portion. In accordance with the Right Hand Rule, the respective magnetic fields generated by the top 142 and bottom 144 portions will combine in their area of overlap, specifically an area substantially proximate to the data layer 106.

Figure 3:
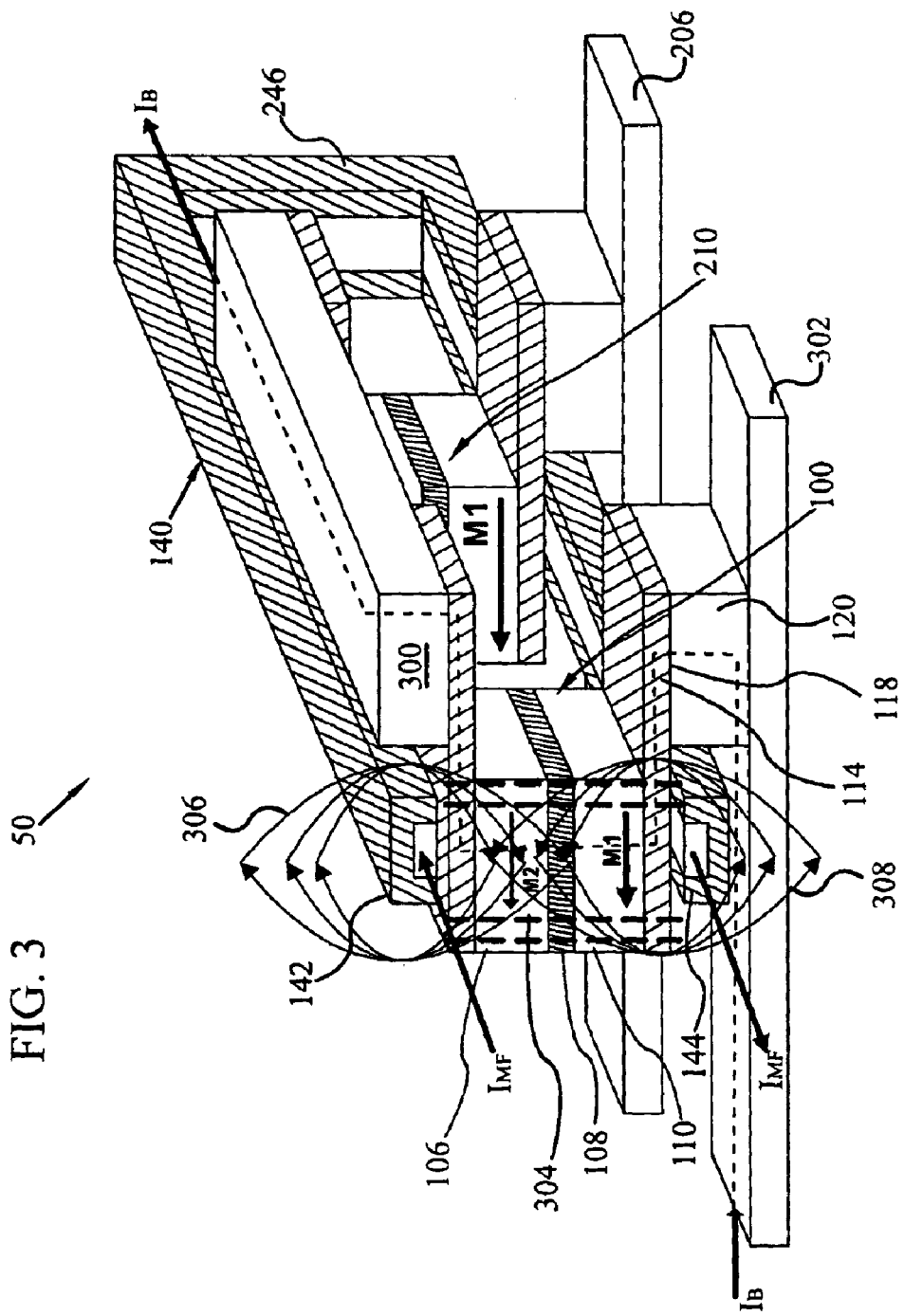
FIG. 3 is a perspective view illustrating the write operation of the memory shown in FIG. 1.

Moreover, passing the looping write conductor 140 about the magnetic memory cell 100 improves the field strength by a factor of two with the same supplied current amplitude. This advantageously reduces the current need required for writing events and might therefore permit a smaller power source, and/or transistor to be used. In addition, in at least one embodiment, the looping write conductor 140 may further comprise a ferromagnetic cladding 148. Applied to the sides and external portion of the magnetic field generating conductor 150, the cladding generally may serve to assist in containing the generated magnetic field and thereby reduce unintended exposure to other non-selected memory cells. As shown in FIG. 3, the looping write conductors 140 and 140' are substantially parallel to the rows 102 and 202. In an alternative embodiment, the configuration of top and bottom offset conductors (112 and 114) may be selected such that the looping write conductors 140 are substantially parallel to the columns.

The reference layer 110 may be a pinned or soft reference layer. In at least one embodiment the reference layer 110 is a soft reference layer, so named because the direction of orientation of magnetization M1 can be dynamically set to a known direction. Such dynamic setting may be achieved by magnetic fields provided by an externally supplied current flowing through the looping write conductor 140 proximate to the memory cell 100. In this case, the current magnitude applying to the looping write conductor 140 to set the magnetization M1 of the soft reference layer to a known direction is relatively small. This current will not alter the magnetization state M2 of the data layer 106 and other unselected memory cells along the looping write conductor 140. Generally, this event is occurring during a read cycle when the magnetization M2 of the reference layer 110 is set to a known direction then to compare with the direction M2 of the data layer 106 to determine the "0" or "1" state of the memory bit cell. It is termed "soft" because it generally comprises materials that are magnetically soft and are not of the usual hard-pinned materials used for more traditional pinned reference layers. When utilizing a soft reference layer, a convention is generally adopted as to which way M1 will be oriented.

The use of a soft reference layer may have several advantageous benefits in the memory cell 100. As a soft reference layer is not substantially fixed in orientation, it may not be necessary to subject the memory cell 100 to high temperatures during manufacturing as is often required to establish a fixed reference layer. In addition, the lack of a substantial and constant magnetic field in the reference layer reduces the likelihood of a demagnetization field from the reference layer acting upon the data layer, thus reducing the offset in the coercive switching field.

The ferromagnetic data layer 106, as well as the cladding 148 of the looping write conductor 140, may be made from a material that includes, but it not limited to: Nickel Iron (NiFe), Nickel Iron Cobalt (NiFeCo), Cobalt Iron (CoFe), and alloys of such metals. Under appropriate circumstances, such as manufacturing preferences, the memory cell 100 may further include additional electrical conductors located between the data layer 106 and the top offset conductor 112, and likewise between the reference layer 110 and the bottom offset conductor 114. In addition, both the reference layer 110 and the data layer 106 may be formed from multiple layers of materials. However, for conceptual simplicity and ease of discussion, each layer component is herein discussed as a single layer.

The phenomenon that causes the resistance in magnetic tunnel junction memory cell 100 is well understood in the magnetic memory art and is well understood for TMR memory cells. GMR and CMR memory cells have similar magnetic behavior but their magneto-resistance arises from different physical effects as the electrical conduction mechanisms are different. For instance, in a TMR-based memory cell, the phenomenon is referred to as quantum-mechanical tunneling or spin-dependent tunneling. In a TMR memory cell, the intermediate layer 108 is a thin barrier of dielectric material through which electrons quantum mechanically tunnel between the data layer 106 and the reference layer 110.

In a GMR memory cell, the intermediate layer 108 is a thin spacer layer of non-magnetic but conducting material. Here the conduction is a spin-dependent scattering of electrons passing between the data layer 106 and the reference layer 110 though the intermediate layer 108. In either case, the resistance between the data layer 106 and the reference layer 110 will increase or decrease depending on the relative orientations of the magnetic fields M1 and M2. It is that difference in resistance that is sensed to determine if the data layer 106 is storing a logic state of "0" or a logic state of "1".

In at least one embodiment, the intermediate layer 108 is a tunnel layer made from an electrically insulating material (a dielectric) that separates and electrically isolates the data layer 106 from the reference layer 110. Suitable dielectric materials for the dielectric intermediate layer 108 may include, but are not limited to: Silicon Oxide ($SiO_2$), Magnesium Oxide (MgO), Silicon Nitride ($SIN_2$), Aluminum Oxide ($Al_2O_3$), Aluminum Nitride ($AlN_x$), and Tantalum Oxide ($TaO_x$).

In at least one other embodiment, the intermediate layer 108 is a tunnel layer made from a non-magnetic material such as a 3d, a 4d, or a 5d transition metal listed in the periodic table of the elements. Suitable non-magnetic materials for a non-magnetic intermediate layer 108 may include, but are not limited to: Copper (Cu), Gold (Au) and Silver (Ag). While the actual thickness of the intermediate layer 108 is dependent upon the materials selected to create the intermediate layer 108 and the type of tunnel memory cell desired, in general, the intermediate layer 108 may have a thickness of about 0.5 nm to about 5.0 nm.

In many applications, read operations outnumber write operations by a considerable factor. The bit of data stored in the data layer 106 can be read during a read operation performed upon the magnetic memory cell 100 by passing a read current $I_R$ through a given row conductor and a given column conductor, and then measuring the resistance between the data layer 106 and the reference layer 110. The logical state of the bit as a "1" or a "0" can be determined by sensing the magnitude of the resistance.

It is generally appreciated in the magnetic memory arts that as the size of a magnetic bit decreases, the coercivity of the bit will increase. For example, a 0.25×0.75 micrometer bit may have a coercivity of about 40 Oe [1 Oe=1000/(4*pi) A/m], whereas a 0.15×0.45 micrometer bit may have a coercivity of about 75 Oe [1 Oe=1000/(4*pi) A/m]. In general, the coercivity of a material will decrease as temperature increases. For example a 100 degrees Celsius rise in temperature may impart a drop in coercivity by about 50%. Upon a decrease in temperature to the original state, the original coercivity will generally return.

As noted above, the looping nature of the looping write conductor 140 permits substantially a two fold concentration of magnetic field strength between the top 142 and bottom 144 portions. To further reduce inadvertently switching the data layer 106' of a non-selected memory cell 100', the combined field strength is less than the coercivity of the unheated memory cell 100'. More specifically, the combined field strength is sufficient to overcome the coercivity of a heated memory cell 100, but not that of an unheated cell. This relative difference in selectively directing susceptibility to the write field advantageously reduces the half-select margin error, a condition where memory cells exposed to some or all of the write magnetic field are inadvertently switched.

In at least one embodiment, the requisite heat required to permit a selected cell to be written may be achieved by passing a bias current through a given magnetic memory cell 100. Specifically, a heating pulse of about 1 to 3 volts may be applied through a selected magnetic memory cell 100. The resistance encountered in the tunneling action of the current causes a significant and localized rise in temperature within the given magnetic memory cell 100. Generally this rise in temperature will not substantially affect neighboring, but unselected magnetic memory cells 100'. In addition, the offset nature of the memory cell 100 generally localizes the resulting heating away from the row 102 and column 104. Should excessive heating result, it is unlikely that such excessive heat will damage either the row 102 or the column 104.

This ability of the memory 50 to store data is exemplified in FIG. 3. An externally supplied bias current, $I_B$ provided by a power source (not shown) is directed through the given magnetic memory cell 100 by selectively paring row 300 and column 302. The tunneling of $I_B$ through the magnetic memory cell 100 produces heat 304 localized to the given magnetic memory cell 100. A magnetic field inducing current $I_{MF}$ provided by a power source (not shown) is directed through the looping write conductor 140. The resulting magnetic fields represented by curved arrows 306 and 308. As the combined vector of the magnetic fields 306 and 308 is to the left, M2 will be aligned to point to the left. In addition, although the orientation of the reference layer may be pinned-on-the fly under appropriate circumstances, the ferromagnetic material comprising the reference layer 110 (be it soft or fixed) is greater than the combined magnetic fields of 306 and 308, even when the reference layer 110 is heated.

In at least one embodiment, $I_{MF}$ is directed through the looping write conductor 140 substantially contemporaneously to the heating achieved within the given magnetic memory cell 100. Under appropriate circumstances, the sensing of resistance to within the given magnetic memory cell 100 may be performed following the bias current pulse. Such sensing of resistance may be used to confirm the write operation upon the data layer 106.

In further example, if the direction of current $I_{MF}$ is reversed in the looping write conductor 140, the resultant magnetic field will have a vector in the counter clockwise direction. When heat 304 is present to sufficiently elevate the temperature of data layer 106 and thereby reduce the coercivity, the counter clockwise vector of the magnetic field will align M2 to point to the right. It should be noted that if the magnetic field M2 of the data layer 106 is already in line with the magnetic fields 306 and 308, the field M2 will not reverse it's orientation even though the coercivity of the data layer has been sufficiently reduced. In other words, if the field M2 is already in line with the fields 306 and 308 it will remain in line.

Moreover, the combined magnetic fields 306 and 308 of the looping write conductor 140 are sufficient to overcome the coercivity of heated data layer 106. As the combined magnetic write fields 306 and 308 may overcome the coercivity of the data layer 106, the orientation of the magnetization M2 may be altered from one orientation to another. In at least one embodiment, the change in orientation performed upon the heated data layer 106 does not affect the orientation of the adjacent non-heated data layers in non-heated memory cell 210.

As a result, in at least one embodiment, the bit to bit pitch of the memory cells 100 (distance between the center points of each cell) may be decreased. Such shortening of bit to bit pitch is advantageous as it permits a greater density of memory cells in a given space, and therefore greater memory capacity. In addition, the relative size of the rows and columns may be reduced as it is not necessary for them to supply the magnetic fields required for a write operation, an advantageous condition allowing greater a reduction in size.

Another embodiment may be appreciated to be a computer system incorporating thermal-assisted switching magnetic memory 50. As has been described above, the physical size of thermal-assisted switching magnetic memory 50 is quite small, thereby permitting a greater volume of storage in the same physical space over contemporary memory devices. A computer with a main board, CPU and at least one memory store comprised of an embodiment of the thermal-assisted switching magnetic memory 50 described above is advantageously fast.

While the invention has been described with reference to the preferred embodiment, it will be understood by those skilled in the art that various alterations, changes and improvements may be made and equivalents may be substituted for the elements thereof and steps thereof without departing from the scope of the present invention. In addition, many modifications may be made to adapt to a particular situation or material to the teachings of the invention without departing from the essential scope thereof. Such alterations, changes, modifications, and improvements, though not expressly described above, are nevertheless intended and implied to be within the scope and spirit of the invention. Therefore, it is intended that the invention not be limited to the particular embodiments disclosed as the best mode comtemplated for carrying out this invention, but that the invention will include all embodiments falling within the scope of the appended claims.

I claim:

1. A thermal-assisted magnetic memory storage device comprising:
    a cross point array of magnetic tunnel junction memory cells, the memory cells comprising a material wherein the coercivity is decreased upon an increase in temperature;
    a plurality of separate looping write conductors positioned within close proximity about each magnetic tunnel junction memory cell.

2. The thermal-assisted magnetic memory storage device of claim 1, wherein the looping write conductors are not in electrical contact with the memory cells.

3. The thermal-assisted magnetic memory storage device of claim 1, wherein the magnetic tunnel junction memory cells are offset.

4. The thermal-assisted magnetic memory storage device of claim 1, wherein a bias current passing through a given memory cell causes localized warming within the given memory cell.

5. A thermal-assisted magnetic memory storage device comprising:
    a plurality of parallel electrically conductive rows;
    a plurality of parallel electrically conductive columns transverse to the rows, the columns and rows thereby forming a cross point array with a plurality of intersections;
    a plurality of offset magnetic tunnel junction memory cells, each memory cell located proximately to and in electrical contact with an intersection between a row and column, the memory cells comprising a material with an alterable orientation of magnetization, wherein the coercivity of the alterable material is decreased upon an increase in temperature; and
    a plurality of separate looping write conductors positioned within close proximity about each magnetic tunnel junction memory cell.

6. The thermal-assisted magnetic memory storage device of claim 5, wherein the looping write conductors are not in electrical contact with the memory cells.

7. The thermal-assisted magnetic memory storage device of claim 5, wherein the looping write conductors further comprise a ferromagnetic cladding.

8. The thermally-assisted magnetic memory storage device of claim 5, wherein during a write operation;
    a bias current is applied to a given magnetic tunnel junction memory cell by a given conductive row and a given conductive column, the bias current warming the given magnetic tunnel junction memory cell;
    a write magnetic field is generated by a current flowing in the write conductor, the looping nature of the conductor about the given magnetic tunnel junction memory cell doubling the write magnetic field saturating the given magnetic tunnel junction memory cell;
    wherein the orientation of magnetization of the material may be changed, the magnetic field provided by the write conductor being greater than the coercivity of the heated material.

9. The thermal-assisted magnetic memory storage device of claim 5, wherein the offset magnetic tunnel junction memory cell is joined to the conductive row by a thin top conductor and joined to the conductive column by a thin bottom conductor, the top and bottom conductors laterally displacing the magnetic tunnel junction memory cell from the cross point axis.

10. The thermal-assisted magnetic memory storage device of claim 9, wherein the lateral displacement of the memory cell positions the top and bottom of the memory cell substantially between the loops of the write conductor.

11. The thermal-assisted magnetic memory storage device of claim 5, wherein the plurality of looping write conductors run parallel to the conductive rows.

12. The thermal-assisted magnetic memory storage device of claim 5, wherein the plurality of looping write conductors run parallel to the conductive columns.

13. The thermal-assisted magnetic memory storage device of claim 5, wherein each memory cell further includes a reference layer characterized by a pinned orientation of magnetization.

14. The thermal-assisted magnetic memory storage device of claim 5, wherein each memory cell further includes a soft ferromagnetic reference layer, the soft reference layer having a non-pinned orientation of magnetization.

15. A thermal-assisted magnetic memory storage device comprising:
 a plurality of parallel electrically conductive rows;
 a plurality of parallel electrically conductive columns transverse to the rows, the columns and rows thereby forming a cross point array with a plurality of intersections;
 a plurality of offset magnetic tunnel junction memory cells, each memory cell located proximately to and in electrical contact with an intersection between a row and column, each memory cell including;
  a top offset electrical conductor joined to the row and extending substantially transversely from the row for a length at least the width of the memory cell;
  at least one ferromagnetic data layer characterized by an alterable orientation of magnetization, the ferromagnetic data layer comprising a material wherein the coercivity is decreased upon an increase in temperature;
  an intermediate layer in contact with the data layer;
  a ferromagnetic reference layer in contact with the intermediate layer, opposite from the data layer;
  a bottom offset electrical conductor parallel to and of substantially the same length as the top offset conductor, the bottom offset conductor joined to the column;
  wherein the top and bottom offset conductors laterally offset the top and bottom of the memory cell from the cross point of the row and column, the bottom offset conductor additionally vertically offsetting the memory cell from the column; and
 a plurality of separate looping write conductors positioned within close proximity to the top and bottom offset conductors of each memory cell, the looping write conductors substantially in line with the laterally offset magnetic tunnel junction memory cells.

16. The thermal-assisted magnetic memory storage device of claim 15, wherein the looping write conductors are not in electrical contact with the memory cells.

17. The thermal-assisted magnetic memory storage device of claim 15, wherein the looping write conductors further comprise a ferromagnetic cladding.

18. The thermally-assisted magnetic memory storage device of claim 15, wherein during a write operation;
 a bias current is applied to a given magnetic tunnel junction memory cell by a given conductive row and a given conductive column, the bias current warming the given magnetic tunnel junction memory cell;
 a write magnetic field is generated by a current flowing in the write conductor, the looping nature of the conductor about the given magnetic tunnel junction memory cell doubling the write magnetic field saturating the given magnetic tunnel junction memory cell;
 wherein the orientation of magnetization of the material may be changed, the magnetic field provided by the write conductor being greater than the coercivity of the heated material.

19. The thermal-assisted magnetic memory storage device of claim 15, wherein the lateral displacement of the memory cell positions the top and bottom of the memory cell substantially between the loops of the write conductor.

20. The thermal-assisted magnetic memory storage device of claim 15, wherein the plurality of looping write conductors run parallel to the conductive rows.

21. The thermal-assisted magnetic memory storage device of claim 15, wherein each memory cell further includes a reference layer characterized by a pinned orientation of magnetization.

22. The thermal-assisted magnetic memory storage device of claim 15, wherein each memory cell further includes a soft ferromagnetic reference layer, the soft reference layer having a non-pinned orientation of magnetization.

23. A computer system comprising:
 a main board;
 at least one central processing unit (CPU) joined to the main board;
 at least one thermal-assisted magnetic memory store joined to the CPU by the main board, thermal-assisted magnetic memory including:
  a plurality of parallel electrically conductive rows;
  a plurality of parallel electrically conductive columns transverse to the rows, the columns and rows thereby forming a cross point array with a plurality of intersections;
  a plurality of offset magnetic tunnel junction memory cells, each memory cell located proximately to and in electrical contact with an intersection between a row and column, the memory cells comprising a material with an alterable orientation of magnetization, wherein the coercivity of the alterable material is decreased upon an increase in temperature; and
  a plurality of separate looping write conductors positioned within close proximity about each magnetic tunnel junction memory cell.

24. The thermal-assisted magnetic memory storage device of claim 23, wherein the looping write conductors are not in electrical contact with the memory cells.

25. The thermally-assisted magnetic memory storage device of claim 23, wherein during a write operation;
 a bias current is applied to a given magnetic tunnel junction memory cell by a given conductive row and a given conductive column, the bias current warming the given magnetic tunnel junction memory cell;
 a write magnetic field is generated by a current flowing in the write conductor, the looping nature of the conductor about the given magnetic tunnel junction memory cell doubling the write magnetic field saturating the given magnetic tunnel junction memory cell;
 wherein the orientation of magnetization of the material may be changed, the magnetic field provided by the write conductor being greater than the coercivity of the heated material.

* * * * *